(12) United States Patent
Aritome

(10) Patent No.: US 8,634,244 B2
(45) Date of Patent: Jan. 21, 2014

(54) ADJUSTING PROGRAM AND ERASE VOLTAGES IN A MEMORY DEVICE

(75) Inventor: Seiichi Aritome, Zhudong Town (TW)

(73) Assignee: Micron Technology, Inc., Boise, ID (US)

( * ) Notice: Subject to any disclaimer, the term of this patent is extended or adjusted under 35 U.S.C. 154(b) by 272 days.

(21) Appl. No.: 13/118,198

(22) Filed: May 27, 2011

(65) Prior Publication Data
US 2011/0228607 A1 Sep. 22, 2011

Related U.S. Application Data

(62) Division of application No. 11/951,171, filed on Dec. 5, 2007, now Pat. No. 7,952,927.

(51) Int. Cl.
G11C 16/04 (2006.01)
(52) U.S. Cl.
USPC ............ 365/185.11; 365/185.17; 365/185.18; 365/185.29
(58) Field of Classification Search
USPC .............. 365/185.11, 185.17, 185.18, 185.29
See application file for complete search history.

(56) References Cited

U.S. PATENT DOCUMENTS

| 6,954,380 | B2 | 10/2005 | Ono et al. |
| 7,061,813 | B2 | 6/2006 | Lee |
| 7,092,292 | B2 | 8/2006 | Mokhlesi et al. |
| 7,310,280 | B2 * | 12/2007 | Park et al. .................. 365/210.1 |
| 7,403,421 | B2 | 7/2008 | Mokhlesi et al. |
| 7,539,061 | B2 * | 5/2009 | Lee .......................... 365/185.22 |
| 7,663,918 | B2 * | 2/2010 | Joo .......................... 365/185.11 |
| 7,688,634 | B2 * | 3/2010 | Richter et al. ............. 365/185.2 |
| 7,952,927 | B2 * | 5/2011 | Aritome .................... 365/185.11 |
| 8,045,372 | B2 * | 10/2011 | Lee .......................... 365/185.02 |
| 2006/0256622 | A1 | 11/2006 | Aritome |
| 2006/0262606 | A1 | 11/2006 | Aritome |
| 2006/0262607 | A1 | 11/2006 | Aritome |
| 2007/0030737 | A1 | 2/2007 | Aritome |
| 2007/0047307 | A1 | 3/2007 | Ogura et al. |

* cited by examiner

Primary Examiner — Pho M Luu
(74) Attorney, Agent, or Firm — Fletcher Yoder

(57) ABSTRACT

A system and apparatus for adjusting threshold program and erase voltages in a memory array, such as a floating gate memory array, for example. One such method includes applying a first voltage level to a first edge word line of a memory block string and applying a second voltage level to a second edge word line of the memory block string. Such a method might also include applying a third voltage level to non-edge word lines of the memory block string.

22 Claims, 5 Drawing Sheets

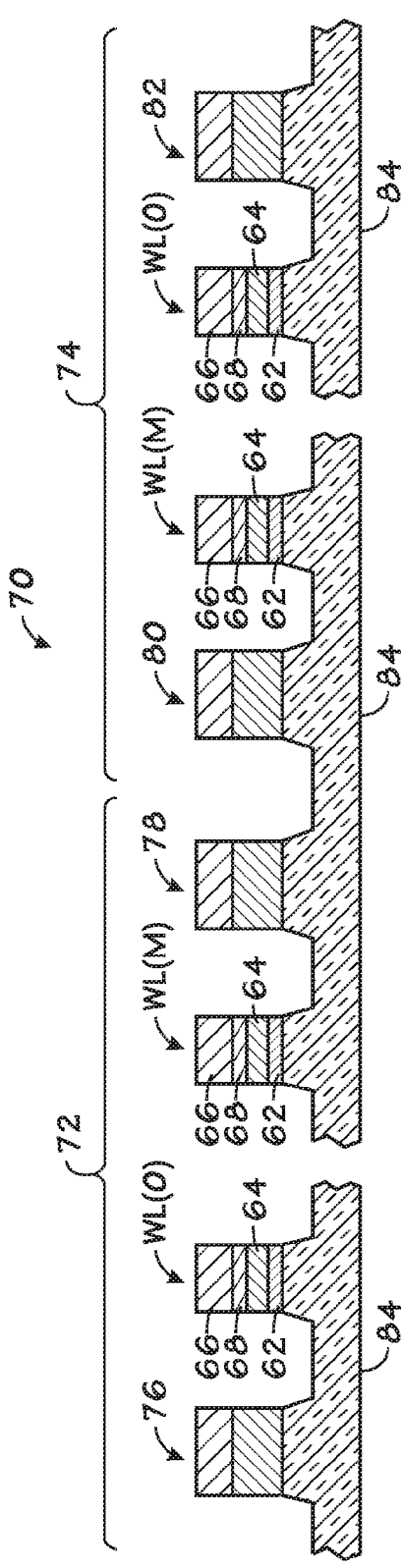
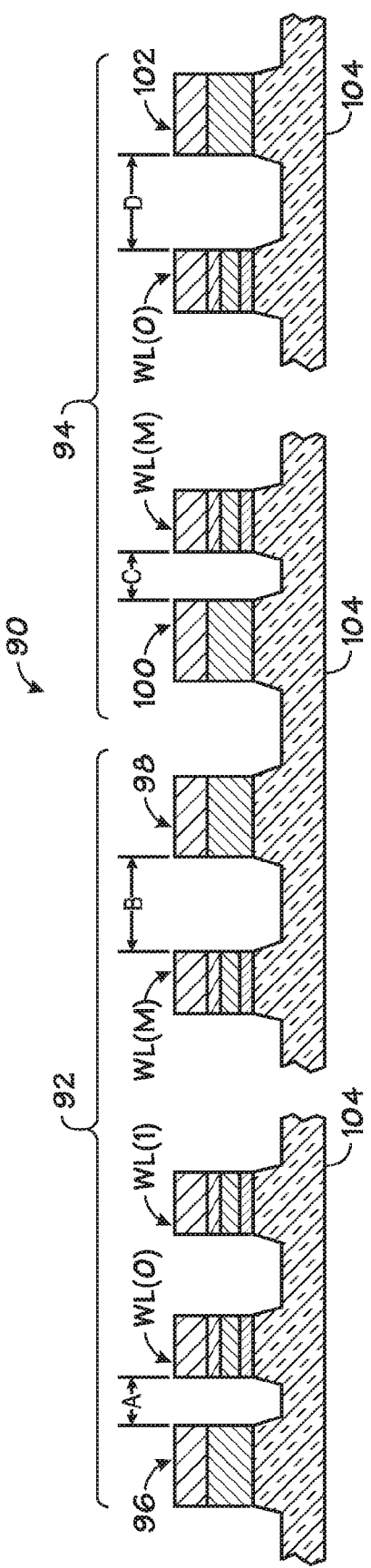

ADJUSTING PROGRAM AND ERASE VOLTAGES IN A MEMORY DEVICE

CROSS-REFERENCE TO RELATED APPLICATIONS

This application is a divisional of U.S. application Ser. No. 11/951,171, filed on Dec. 5, 2007, which issued as U.S. Pat. No. 7,952,927 on May 31, 2011.

BACKGROUND

1. Field of the Invention

Embodiments of the present invention relate generally to memory devices and, more particularly, in one or more embodiments, to adjusting erase voltages in memory devices.

2. Description of the Related Art

Processor-based systems, such as computers, typically include one or more memory devices to provide storage capability for the system. System memory is generally provided in the form of one or more integrated circuit chips or devices and generally includes both random access memory (RAM) and read-only memory (ROM). System RAM is typically large and volatile and provides the system's main memory. Static RAM and Dynamic RAM are commonly employed types of random access memory. In contrast, system ROM is generally small and includes non-volatile memory for storing initialization routines and identification information. Electrically-erasable read only memory (EEPROM) is one commonly employed type of memory, wherein an electrical charge may be used to program and/or erase data in the memory.

One type of non-volatile memory that is of particular use is a flash memory. A flash memory is a type of EEPROM that can be erased and reprogrammed in blocks. Flash memory is often employed in personal computer systems in order to store the Basic Input Output System (BIOS) program such that it can be easily updated. Flash memory is also employed in wireless electronic devices, because it enables the manufacturer to support new communication protocols as they become standardized and provides the ability to remotely upgrade the device for enhanced features.

Flash memory includes a memory array having a large number of memory cells arranged in "rows" and "columns". The memory cells are generally grouped into pages which may be programmed simultaneously. Additionally, the pages are grouped into blocks and the cells within a block may all be erased simultaneously. Each of the memory cells includes a memory cell with a charge storage node, such as a floating-gate field-effect transistor capable of holding a charge. Other charge storage nodes could include, for example, charge trapping layers and the like. Floating gate memory cells differ from standard MOSFET designs in that they include an electrically isolated gate, referred to as the "floating gate," in addition to the standard control gate. The floating gate is generally formed over the channel and separated from the channel by a gate oxide. The control gate is formed directly above the floating gate and is separated from the floating gate by another thin oxide layer. A floating gate memory cell stores information by holding electrical charge within the floating gate. By adding or removing charge from the floating gate, the threshold voltage of the cell changes, thereby defining whether this memory cell is programmed or erased.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected to a select line, which is often referred to as a word line. Columns of the array include strings (often termed NAND strings) of memory cells connected together in series, source to drain, between a pair of select lines, a source select line and a drain select line. The source select line includes a source select gate at each intersection between a NAND string and the source select line, and the drain select line includes a drain select gate at each intersection between a NAND string and the drain select line. The select gates are typically field-effect transistors. Each source select gate is connected to a source line, while each drain select gate is connected to a transfer line, which is often referred to as a bit line.

The memory array is accessed by a row decoder activating a row of memory cells by selecting the word line connected to a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the source line to the bit line through each NAND string via the corresponding select gates, restricted only by the selected memory cells of each string. This places the current-encoded data values of the row of selected memory cells on the bit lines.

As mentioned above, memory cells may be programmed on a page basis and erased on a block basis. However, memory cells adjacent to the select gates (referred to as "edge memory cells") have shown slower program and erase times than other memory cells. This is due in part to the edge cells having a low coupling ratio with the source or drain select gates to which they are adjacent and a higher coupling ratio with the substrate. Additionally, the coupling ratio of the edge memory cells with the select gates is inconsistent due to misalignment between the memory cells. The misalignment occurs during processes commonly used to manufacture the floating gate memory devices. Additionally, where blocks are manufactured in block pairs, i.e., even and odd blocks, the misalignment is generally different between the first block and the second block of the block pair. The variance in program and erase times caused by the misalignment of the memory cells is generally undesirable.

Embodiments of the present invention may be directed to one or more of the problems set forth above.

BRIEF DESCRIPTION OF THE DRAWINGS

FIG. 4 is a cross-sectional view of a paired NAND string having even and odd blocks in accordance with embodiments of the present invention;

FIG. 5 is a cross-sectional view of a paired NAND string having even and odd blocks that have inconsistent select gate to memory cell spacing in accordance with embodiments of the present invention.

DETAILED DESCRIPTION

Figure 1:
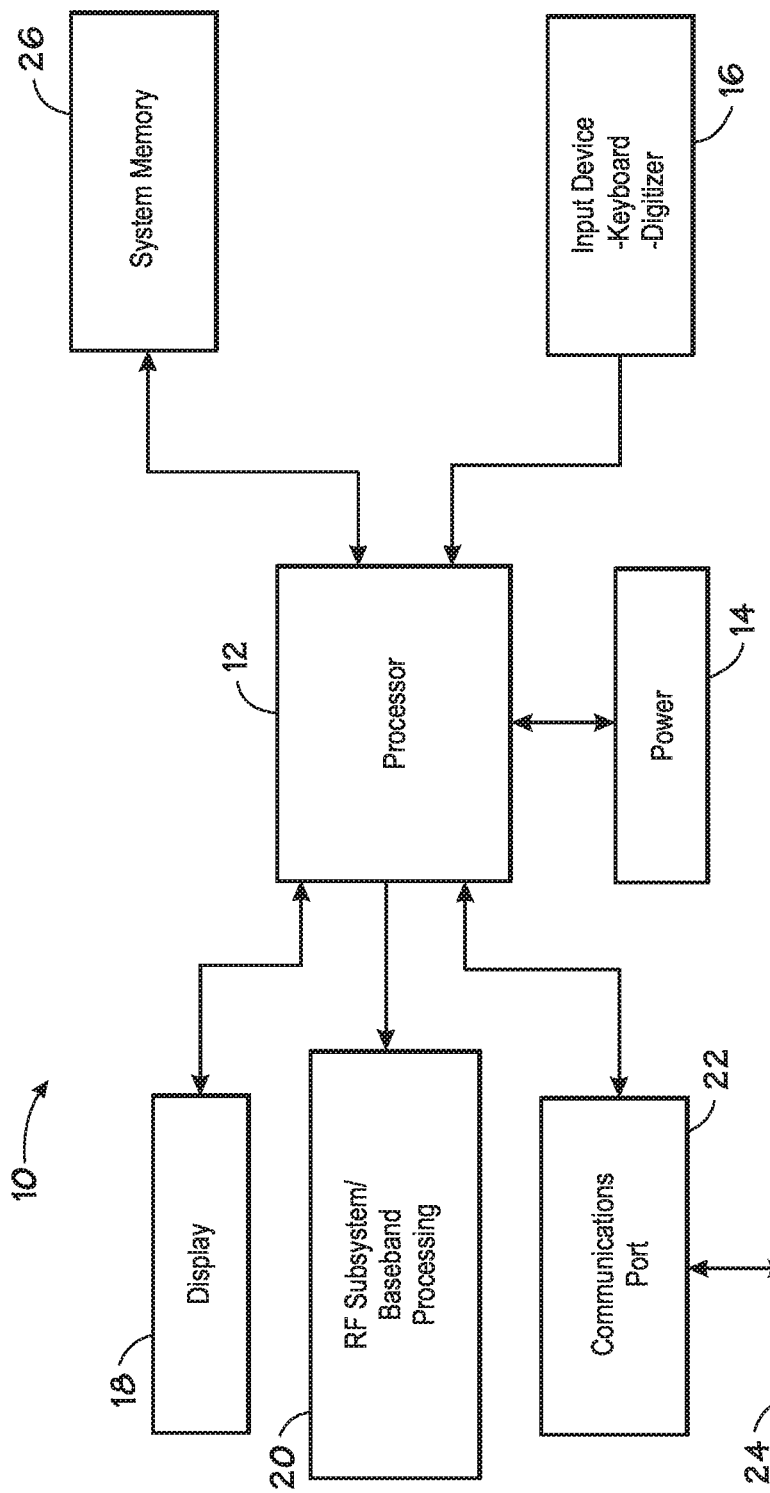
FIG. 1 illustrates a block diagram of a processor-based device having a memory that includes memory devices fabricated in accordance with embodiments of the present invention.

Turning now to the drawings, and referring initially to FIG. 1, a block diagram depicting a processor-based system, generally designated by reference numeral 10, is illustrated. The system 10 may be any of a variety of types such as a computer, pager, cellular phone, personal organizer, control circuit, etc. In a typical processor-based device, a processor 12, such as a microprocessor, controls the processing of system functions and requests in the system 10. Further, the processor 12 may comprise a plurality of processors that share system control.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example.

Furthermore, an RF sub-system/baseband processor 20 may also be coupled to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

Because the processor 12 controls the functioning of the system 10 by implementing software programs, memory is used to enable the processor 12 to be efficient. Generally, the memory is coupled to the processor 12 to store and facilitate execution of various programs. For instance, the processor 12 may be coupled to system memory 26, which may include volatile memory, such as Dynamic Random Access Memory (DRAM) and/or Static Random Access Memory (SRAM). The system memory 26 may also include non-volatile memory, such as read-only memory (ROM), EEPROM, and/or flash memory to be used in conjunction with the volatile memory. As described further below, the system memory 26 may include one or more memory devices, such as flash memory devices, that may include a floating gate memory array fabricated in accordance with embodiments of the present invention.

Figure 2:
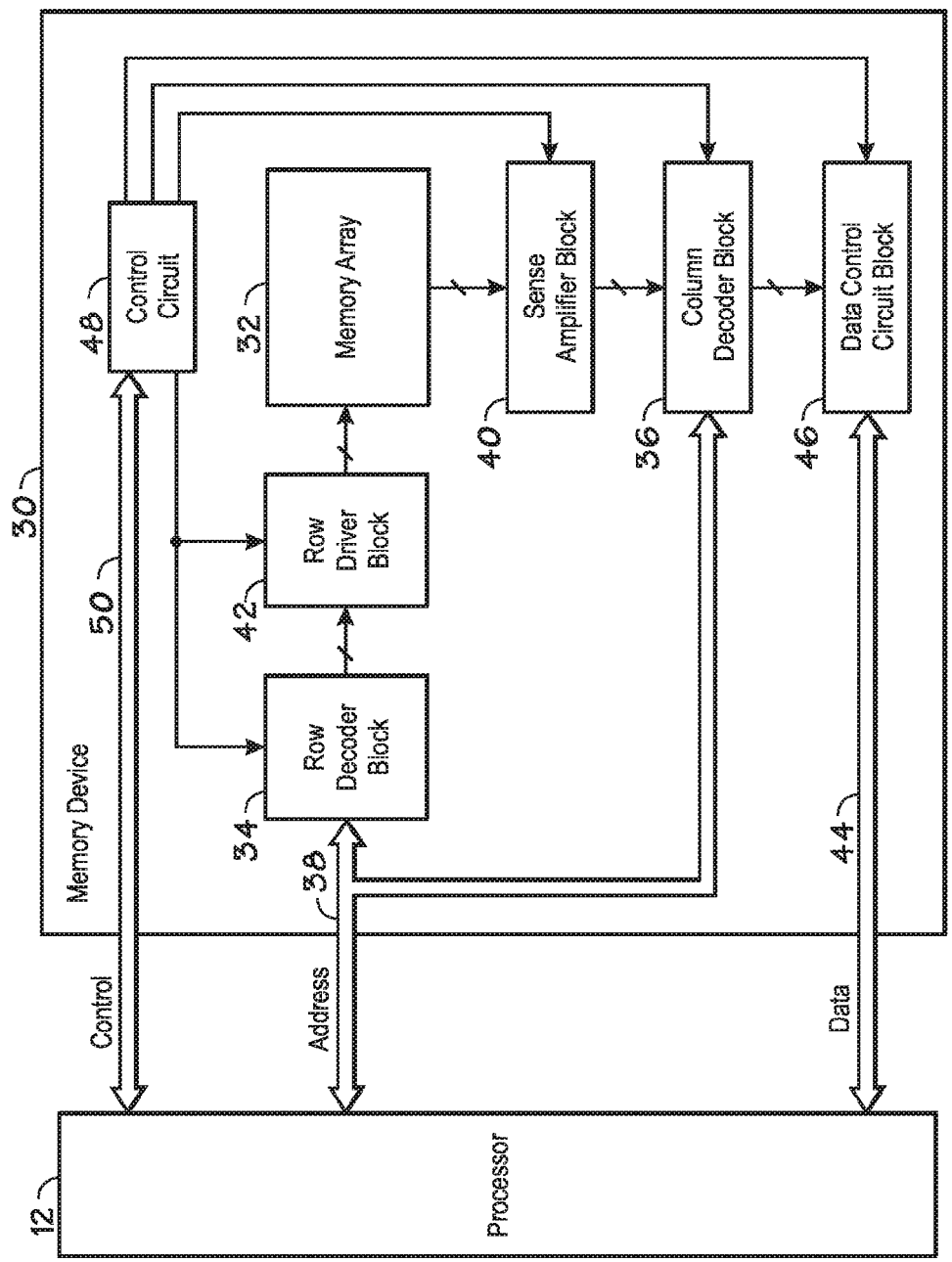
FIG. 2 illustrates a block diagram of a memory device having a memory array fabricated in accordance with embodiments of the present invention.

A block diagram illustrating a flash memory device 30 that may be included as a portion of the system memory 26 of FIG. 1 is illustrated in FIG. 2. As will be described further below with respect to FIG. 3, the flash memory device 30 may be a NAND flash memory device. The flash memory device 30 generally includes a memory array 32. The memory array 32 generally includes many rows and columns of conductive traces arranged in a grid pattern to form a number of memory cells. The sense lines that make up the memory array 32 are generally referred to as "word lines", rows or row lines. The "transfer lines" are generally referred to as "bit lines", "digit lines", columns or column lines. The size of the memory array 32 (i.e., the number of memory cells) will vary depending on the size of the flash memory device 30.

To access the memory array 32, a row decoder block 34 and a column decoder block 36 are provided and are configured to receive and translate address information from the processor 12 via the address bus 38 to access a particular memory cell in the memory array 32. A sense amplifier block 40 having a plurality of the sense amplifies is also provided between the column decoder 36 and the memory array 32 to sense and amplify individual values stored in the memory cells. Further, a row driver block 42 is provided between the row decoder block 34 and the memory array 32 to activate selected word lines in the memory array according to a given row address.

During read and write operations, data may be transferred to and from the flash memory device 30 via the data bus 44. The coordination of the data and address information may be conducted through a data control circuit block 46. Finally, the flash memory device 30 may include a control circuit 48 configured to receive control signals from the processor 12 via the control bus 50. The control circuit 48 is coupled to each of the row decoder block 34, the column decoder block 36, the sense amplifier block 40, the row driver block 42 and the data control circuit block 46, and is generally configured to coordinate timing and control among the various circuits in the flash memory device 30.

Figure 3:
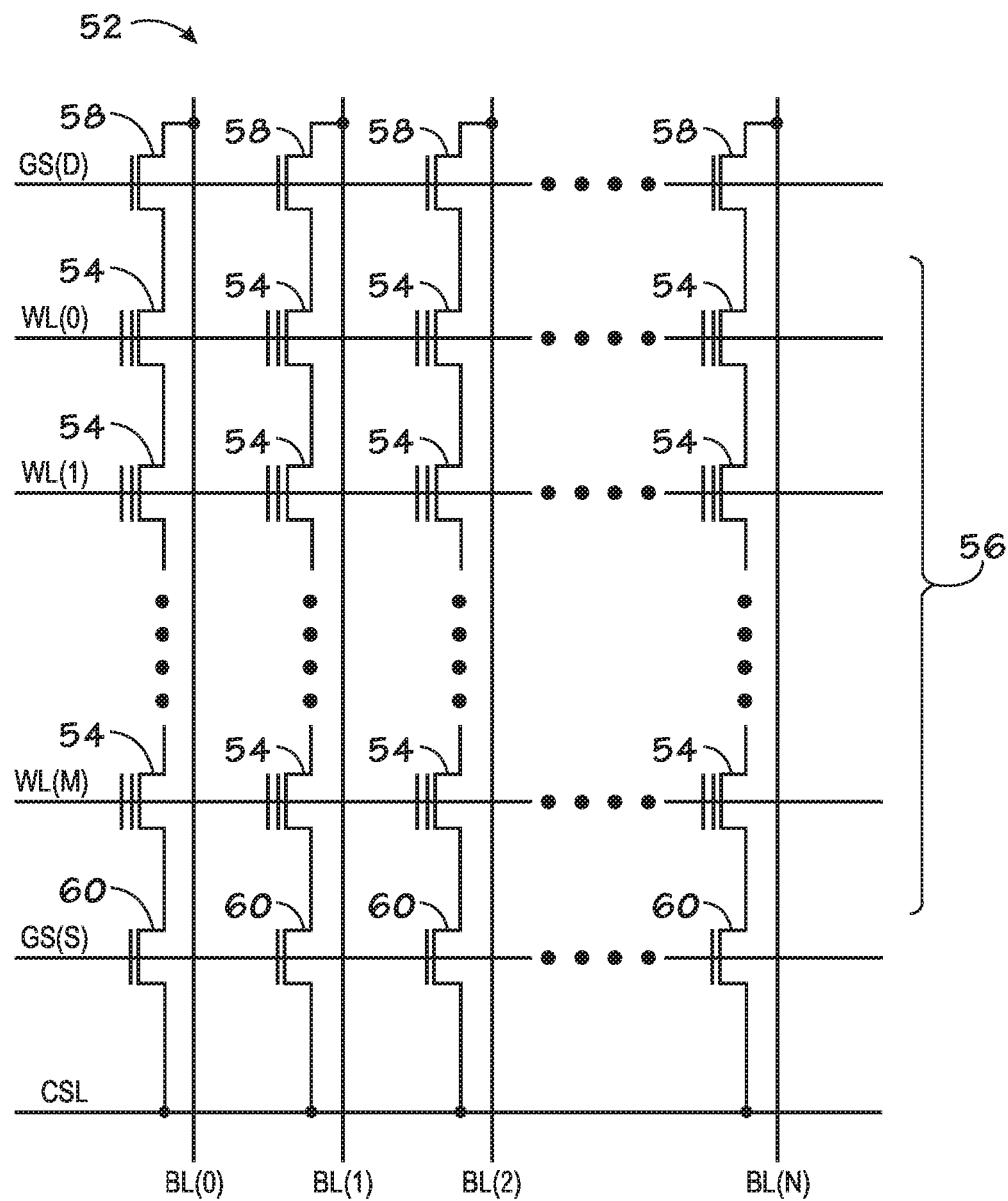
FIG. 3 is schematic diagram of a NAND flash memory array having memory cells fabricated in accordance with embodiments of the present invention.

An embodiment of the memory array 32 of FIG. 2 is illustrated in FIG. 3. In the present embodiment, the memory array 32 comprises a NAND memory array 52. The NAND memory array 52 includes word lines WL(0)-WL(M) and intersecting local bit lines BL(0)-BL(M). As will be appreciated, for ease of addressing in the digital environment, the number of word lines WL and the number of bit lines BL are each a power of two (e.g., 256 word lines WL by 4,096 bit lines BL). The local bit lines BL are coupled to global bit lines (not shown) in a many-to-one relationship.

The NAND memory array 52 includes a floating gate transistor 54 located at each intersection of a word line WL and a local bit line BL. The floating gate transistors 54 serve as non-volatile memory cells for storage of data in the NAND memory array 52, as previously described. As will be appreciated, each floating gate transistor includes a source, a drain, a floating gate, and a control gate. The control gate of each floating gate transistor 54 is coupled to a respective word line WL. The floating gate transistors 54 are connected in series, source to drain, to form a NAND string 56 formed between gate select lines. Specifically, the NAND strings 56 are formed between the drain select line GS(D) and the source select line GS(S). The drain select line GS(D) is coupled to each NAND string 56 through a respective drain select gate 58. Similarly, the source select line GS(S) is coupled to each NAND string 56 through a respective source select gate 60. The drain select gates 58 and the source select gates 60 may each comprise a field-effect transistor (FET), for instance. A column of the memory array 52 includes a NAND string 56 and the source select gate 60 and drain select gate 58 connected thereto. A row of the floating gate transistors 52 are those transistors commonly coupled to a given word line WL.

The source of each source select gate 60 is connected to a common source line CSL. The drain of each source select gate is coupled to the source of a floating gate transistor 54 in a respective NAND string 56. The gate of each source select gate 60 is coupled to the source select line GS(S).

The drain of each drain select gate 58 is connected to a respective local bit line BL for the corresponding NAND string 56. The source of each drain select gate 58 is connected to the drain of a floating gate transistor 54 of a respective NAND string 56. Accordingly, as illustrated in FIG. 3, each NAND string 56 is coupled between a respective drain select gate 58 and source select gate 60. The gate of each drain select gate 58 is coupled to the drain select line GS(D).

Differential voltages across the word lines alter the charge in the floating gates to program or erase the memory cells. Specifically, in programming the memory cells, a voltage is applied to the control gate while a program or inhibit voltage is applied to the bit lines. The voltage applied to the control gate may be between 15 and 20 volts, for example. Alternatively, during an erase operation the substrate is raised to a high voltage, such as 20 volts, for example, while the word lines are coupled to ground or a low voltage, i.e. 1.5 volts or less. The source select and drain select gates are left floating during the erase operation, so that electrons flow out of the floating gate and into the substrate.

As mentioned above, the edge memory cells (i.e., the memory cells adjacent to the select gates) have shown slower program and erase times than other memory cells in a typical memory array due in part to the edge cells having a low coupling ratio with the select gates and a higher coupling ratio with the substrate tub. FIG. 4 is a cross-sectional view of a paired NAND string 70. Each floating gate transistor in the paired NAND string 70 generally includes a gate dielectric 62, such as silicon dioxide ($SiO_2$). Each floating gate transistor also includes an isolated floating gate 64, which may comprise polysilicon, for example. As previously discussed, each floating gate transistor also includes a control gate 66, which may be formed of a single conductive layer, such as polysilicon. Because of the configuration and operation of the memory array, each of the floating gate transistors in a single word line WL may share a common control gate 66. The floating gates 64 and control gate 66 are electrically isolated from one another by an inter-gate dielectric layer 68. The inter-gate dielectric layer 68 may comprise $SiO_2$ or $SiN_X$, for example.

The paired NAND string 70 includes an even block 72 and an odd block 74, each having source select gates 76 and 82, respectively, and drain select gates 78 and 80, respectively. The even and odd word lines WL(0)-WL(M) are located in between the select gates 76 and 78 in the even block 72 and select gates 80 and 82 in the odd block 74. As discussed above, a program voltage is applied to the control gate 66 to program the memory cells, while an erase voltage is applied to the substrate 84 during an erase operation. However, the program and erase times for the memory cells may vary. In particular, the memory cells of the edge word lines may be slower during both the program and erase operations.

The slower program and erase of edge word lines may be due, in part, to misalignment of the edge word lines with respect to select gates during the manufacturing processes. FIG. 5 illustrates a cross-sectional view of a paired NAND string 90 where such misalignment has occurred. Similar to the paired NAND string 70 of FIG. 4, the paired NAND string 90 has both an even block 92 and an odd block 94. The even block 92 has a source select gate 96 and a drain select gate 98, and the odd block 94 has a drain select gate 100 and a source select gate 102. The word lines are located in between the select gates 96, 98, 100 and 102 of the even and odd blocks 92 and 94.

As illustrated in FIG. 5, the WL(0) of the even block, which is referred to hereinafter as the "even WL(0)", has been misaligned so that it is located a distance A from the source select gate 96, while the WL(M) of the even block (which is referred to hereinafter as the "even WL(M)") is located a distance B from the even select gate 98. Similarly, the WL(M) of the odd block, which is referred to hereinafter as the "odd WL(M)", has been misaligned relative to the drain select gate 100 so that they are a distance C apart and the WL(0) of the odd block, which is referred to hereinafter as the "odd WL(0)", is located a distance D from the source select gate 102. In this example, the distances A and C are approximately equal and less than the distances B and D, which are also approximately equal. Because of the misalignment, the coupling ratio of the edge memory cells with the select gates is inconsistent between the even and odd NAND strings 92 and 94, exacerbating an existing inconsistency in the program and erase times for the memory cells.

In order to compensate for the slower program and erase times of the edge word lines, different voltage levels may be applied to adjust an erase voltage threshold $V_t$ for memory cells of edge word lines. Thus, the differential voltage between the memory cells and the substrate 84 can vary across the memory cells of the NAND string 70. In the case of a program operation where the distance A between the even WL(0) and the source select gate 96 is less than the distance B between the even WL(M) and the drain select gate 98, the program voltage $V_{pg}$ of the even WL(0) may be set to be greater than the program voltage $V_{pg}$ of the even WL(M). Similarly, the program voltage $V_{pg}$ for the odd WL(M) may be set to be greater than the program voltage $V_{pg}$ from the odd WL(0). Additionally, the program voltage $V_{pg}$ for the even WL(0) may be equal to or greater than the program voltage $V_{pg}$ of the odd WL(M), and the program voltage $V_{pg}$ for the odd WL(0) may be greater than or equal to the program voltage $V_{pg}$ for the even WL(M).

Thus, the following relationship is established for the respective program voltages when the distance A is less than the distance B: $V_{pg}$ for even WL(0)≥$V_{pg}$ for odd WL(M)>$V_{pg}$ for odd WL(0)≥$V_{pg}$ for even WL(M). In the event that the even WL(0) is closer to the source select gate 96 than the even WL(M) is to the drain select gate 98, the respective voltage may be: $V_{pg}$ for even WL(0)=16.8; $V_{pg}$ for odd WL(M)=16.6; $V_{pg}$ for even WL(M) 16.0; $V_{pg}$ for odd WL(0)=16.2. Alternatively, if the distance A is greater than the distance B, the relationship between the various program voltages may be: $V_{pg}$ for odd WL(0)≥$V_{pg}$ for even WL(M)>$V_{pg}$ even WL(0) ≥$V_{pg}$ for odd WL(M).

Providing the multiple program voltages levels allows for word line specific adjustments to the program speeds of the memory cells to reduce the variability in program times of the memory cells. Various voltage levels may also be implemented for erase operations to reduce the variability in erase times of the memory cells.

As mentioned above, during an erase operation, a high voltage is applied to the substrate and, generally, the control gate is coupled to a reference potential, such as ground. However, in order to provide more consistent erase times for memory cells within a block, erase voltages may be applied to the control gates. The application of different erase voltages to the control gates adjusts the erase voltage threshold $V_t$ and helps to compensate for misalignment of the memory cells relative to the select gates. The voltages applied may range from approximately 0 volts to approximately 2.5 volts. For example, for erasure of the memory cells of the even NAND string 92, when the distance A is less than the distance B, the erase voltage applied to the even WL(0) may be zero volts, the erase voltage applied to the even WL(M) may be 0.5 volts, and the erase voltage applied to even WL(1)-WL(M−1) may be 1.5 volts. Because the distance C is approximately equal to the distance A, the erase voltage level applied to the odd WL(M) may be approximately the same as that applied to the even WL(0) (i.e., zero volts), while the erase voltage applied to the odd WL(0) may be equal to the erase voltage applied to the even WL(M) (i.e., 0.5 volts). In both the even and odd block strings 92 and 94, the erase voltage levels applied to the edge memory cells coupled to WL(0) and WL (M) are less than the erase voltage levels applied to the other memory cells in the respective NAND block strings 92 and 94.

In implementing the different program and erase voltages for the edge word lines, the voltage levels should be determined based on the physical characteristics of the blocks and not logical associations with other memory cell. In particular, NAND memory arrays may include a section of odd and even memory block strings that are configured to be used in the event of failure of a memory block strings that are currently in use. These redundant even and odd blocks may be assigned to replace either even or odd blocks and, as a result, may be logically associated with a block that is physically different than the redundant block. Specifically, for example, a redundant even block may replace an odd block. Where the redundant even block is being used to replace an odd block, the program and erase voltage levels for even blocks will be used, even though logically the memory cell may be associated or recognized as an odd block. Similarly, a physical odd block used to replace a logical even block would use the program and erase voltages for a physical odd block, not an even block. Thus, the voltages implemented are consistent based on the physical characteristics of the blocks.

Figure 6:
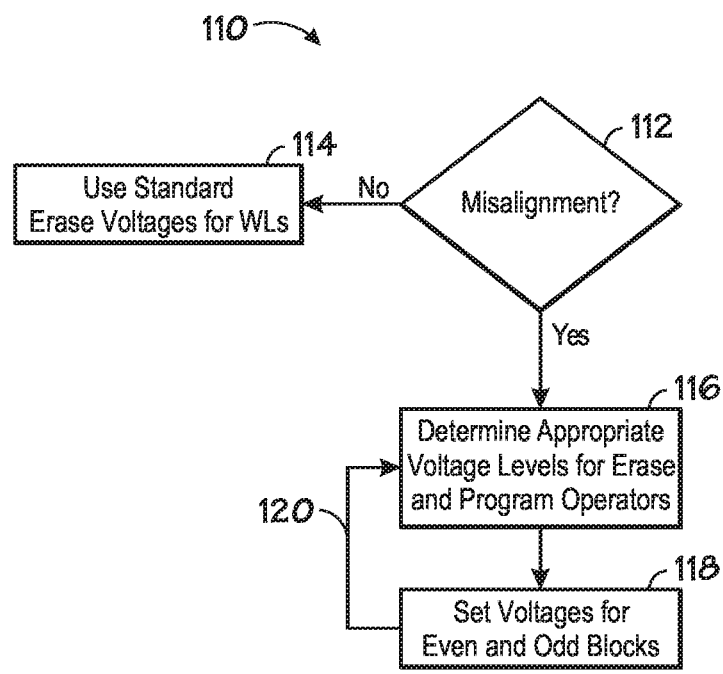
FIG. 6 illustrates a technique for applying erase voltages to memory cells in accordance with embodiments of the present invention.

In view of the foregoing, a flow chart illustrating an exemplary technique for applying program and erase voltages to memory cells of a floating gate memory array is shown in FIG. 6 and generally referred to by the reference numeral 110. The technique 110 begins by determining whether the memory cells are misaligned, as indicated at block 112. This determination may be performed in several ways. For example, in accordance with one technique, misalignment may be determined based on the relative program and erase times of the edge lines in the odd and even blocks. Specifically, if the even word line WL(0) is erasing approximately as fast as the odd word line WL(M) and both are erasing faster than the even word line WL(M) and the odd word line WL(0), then it may indicate that there is a misalignment. The sense amplifier block 40 of FIG. 2 may be used to obtain information in this regard. Specifically, the sense amplifier block 40 may determine whether an erase or program operation has been successful for all the word lines in a block and whether the operation needs to be performed again for particular word line. This information can be used to determine whether the blocks are exhibiting signs characteristic of a misalignment. If it is determined that the memory cells are not misaligned, then standard voltages may be used, as indicated at block 114.

Alternatively, however, if it is determined that the memory cells are misaligned, word line specific voltages may be determined to perform the program and erase operation, as indicated at block 116. The determination of specific voltages for the program and erase operations may be determined based on the specific characteristics of the particular memory array or, alternatively, the voltages may be determined based on average effective erase and program voltages used in similar memory cells. For example, the specific voltages for the program and erase operations may be set by applying an algorithm to the data retrieved by the sense amplifiers 40 that can adjust the program and erase voltages to optimal levels. Alternatively, the voltage levels for odd and even blocks may be programmed in advance and once it is determined that the memory cells are misaligned, the programmed voltage levels are used. Regardless, in setting the program and erase voltages, edge word lines WL(0) and WL(M) in the even and odd blocks should be correlated as set forth above. For example, for the erase operation, the even WL(0) and the odd WL (M) erase voltages may be set equal to each other and the odd WL (0) and even WL (M) erase voltages may be set equal to each other.

After the appropriate voltage levels have been determined, the program and erase voltages are set, as indicated at block 118, and the memory array may be used. In accordance with one embodiment, if the edge word lines WL(0) and WL(M) continue to exhibit slower program and erase times, the voltage levels may be determined again, as indicated by arrow 120.

While embodiments of the invention may be susceptible to various modifications and alternative forms, specific embodiments have been shown by way of example in the drawings and have been described in detail herein. However, it should be understood that the invention is not intended to be limited to the particular forms disclosed. Rather, embodiments of the invention are to cover all modifications, equivalents, and alternatives falling within the spirit and scope of these embodiments, as defined by the following appended claims.

What is claimed is:

1. A memory array comprising:
   a string of memory cells comprising:
   a first edge cell, a second edge cell and a plurality of non-edge cells there between;
   a first select gate immediately adjacent and coupled to the first edge cell;
   a second select gate immediately adjacent and coupled to the second edge cell, wherein a first distance between the first edge cell and the first select gate is different from a second distance between the second edge cell and the second select gate, and wherein the first edge cell is configured to receive a first program voltage and wherein the second edge cell is configured to receive a second program voltage during a programming operation.

2. The memory array of claim 1, wherein the first distance is less than the second distance.

3. The memory array of claim 2, wherein the first program voltage is greater than the second program voltage.

4. The memory array of claim 1, wherein the string of memory cells is organized into a first block and a second block and wherein the first edge cell, the second edge cell, the plurality of non-edge cells, the first select gate and the second select gate are arranged in the first block.

5. The memory array of claim 4, wherein the second block comprises:
   a third edge cell, a fourth edge cell and a plurality of non-edge cells there between;
   a third select gate immediately adjacent and coupled to the third edge cell; and
   a fourth select gate immediately adjacent and coupled to the fourth edge cell.

6. The memory array of claim 5, wherein a third distance between the third edge cell and the third select gate is different from a fourth distance between the fourth edge cell and the fourth select gate.

7. The memory array of claim 5, wherein the third distance is less than the fourth distance.

8. The memory array of claim 5, wherein the third edge cell is configured to receive a third program voltage and wherein the fourth edge cell is configured to receive a fourth program voltage during the programming operation.

9. The memory array of claim 8, wherein each of the first program voltage, the second program voltage, the third program voltage and the fourth program voltage are each different voltages.

10. The memory array of claim 1, wherein the first select gate is a source select gate, and wherein the second select gate is a drain select gate of the second block.

11. The memory array of claim 1, wherein, during an erase operation, the non-edge cells are configured to receive a first erase voltage, and wherein the first edge cell and the second edge cell are configured to receive an erase voltage that is lower than the first erase voltage.

12. The memory array of claim 1, wherein, during an erase operation, the non-edge cells are configured to receive a first erase voltage, wherein the first edge cell is configured to receive a second erase voltage and wherein the third edge cell is configured to receive a third erase voltage, wherein each of the second erase voltage and the third erase voltage is lower than the first erase voltage.

13. The memory array of claim 12, wherein the second voltage is different from the third voltage.

14. A memory array comprising:
a string of memory cells comprising:
a drain select gate;
a source select gate; and
a first edge cell arranged directly adjacent to the drain select gate at a first distance from the drain select gate; and
a second edge cell arranged directly adjacent to the source select gate at a second distance from the source select gate, wherein the first distance is different from the second distance, and wherein the first edge cell is configured to receive a first program voltage and wherein the second edge cell is configured to receive a second program voltage during a programming operation, wherein the first program voltage is different than the second program voltage.

15. The memory array of claim 14, comprising a plurality of non-edge cells arranged between the first edge cell and the second cell, wherein, during an erase operation, the non-edge cells are configured to receive an erase voltage that is higher than erase voltages that the first edge cell and the second edge cell are configured to receive.

16. The memory array of claim 15, wherein, during an erase operation, the first edge cell is configured to receive a first erase voltage and wherein the second edge cell is configured to receive a second erase voltage, wherein the first erase voltage is different than the second erase voltage.

17. A memory array comprising:
a control gate of a first edge memory cell of a string configured to receive a first voltage level during an operation of the memory array;
a control gate of a second edge memory cell of the string configured to receive a second voltage level during the operation; and
a control gate of at least one of a plurality of non-edge memory cells of the string configured to receive a third voltage level during the operation, wherein the operation comprises an erase operation and wherein the third voltage level is greater than the first and second voltage levels.

18. The method of claim 17, wherein the first voltage level is approximately 0 volts, and the second and third voltage levels are each between approximately 0.5 volts and 2.5 volts.

19. The method of claim 17, wherein the first and second voltage levels are determined based upon the distance between the control gates of the first edge memory cell and the second edge memory cell to select gates of the string.

20. The method of claim 17, wherein the first edge memory cell and the second edge memory cell of the string are part of a first block in a pair of blocks, wherein the first edge memory cell is adjacent to a source select gate of the first block and the second edge memory cell is adjacent to a drain select gate of the first block.

21. The method of claim 20, wherein applying the first voltage level to the control gate of the first edge memory cell comprises applying the first voltage level to a control gate of a first edge memory cell of a second block in the pair of blocks, and wherein applying the second voltage level to the control gate of the second edge memory cell comprises applying the second voltage level to a control gate of a second edge memory cell of the second block.

22. The method of claim 21, wherein the first edge memory cell of the second block is adjacent to a drain select gate of the second block and the second edge memory cell of the second block is adjacent to a source select gate of the odd block string.

* * * * *

UNITED STATES PATENT AND TRADEMARK OFFICE
CERTIFICATE OF CORRECTION

| | | |
|---|---|---|
| PATENT NO. | : 8,634,244 B2 | Page 1 of 1 |
| APPLICATION NO. | : 13/118198 | |
| DATED | : January 21, 2014 | |
| INVENTOR(S) | : Seiichi Aritome | |

It is certified that error appears in the above-identified patent and that said Letters Patent is hereby corrected as shown below:

In the Claims:

Column 10, line 18 (claim 18, line 1) delete "method of claim" and insert --memory array of claim--

Column 10, line 21 (claim 19, line 1) delete "method of claim" and insert --memory array of claim--

Column 10, line 25 (claim 20, line 1) delete "method of claim" and insert --memory array of claim--

Column 10, line 31 (claim 21, line 1) delete "method of claim" and insert --memory array of claim--

Column 10, line 40 (claim 22, line 1) delete "method of claim" and insert --memory array of claim--

Signed and Sealed this
Twentieth Day of May, 2014

Michelle K. Lee
*Deputy Director of the United States Patent and Trademark Office*